(12) United States Patent
Mizuuchi et al.

(10) Patent No.: US 7,551,654 B2
(45) Date of Patent: Jun. 23, 2009

(54) COHERENT LIGHT SOURCE AND OPTICAL SYSTEM

(75) Inventors: Kiminori Mizuuchi, Osaka (JP); Kazuhisa Yamamoto, Osaka (JP); Ken'ichi Kasazumi, Osaka (JP); Isao Kidoguchi, Hyogo (JP); Yasuo Kitaoka, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 10/591,983

(22) PCT Filed: Feb. 22, 2005

(86) PCT No.: PCT/JP2005/002797

§ 371 (c)(1),
(2), (4) Date: May 22, 2007

(87) PCT Pub. No.: WO2005/088787

PCT Pub. Date: Sep. 22, 2005

(65) Prior Publication Data

US 2007/0263678 A1    Nov. 15, 2007

(30) Foreign Application Priority Data

Mar. 10, 2004 (JP) .............................. 2004-066879

(51) Int. Cl.
*H01S 3/10* (2006.01)
*H01S 5/00* (2006.01)
(52) U.S. Cl. .................... 372/22; 372/21; 372/49.01
(58) Field of Classification Search .............. 372/21–22
See application file for complete search history.

(56) References Cited

U.S. PATENT DOCUMENTS

| 6,144,683 A | 11/2000 | Floyd |
| 6,282,220 B1 | 8/2001 | Floyd |
| 6,477,188 B1 | 11/2002 | Takaoka et al. |
| 7,149,237 B2 * | 12/2006 | Egawa et al. ................. 372/59 |
| 2002/0136255 A1 | 9/2002 | Takayama et al. |

(Continued)

FOREIGN PATENT DOCUMENTS

FR       2839890 A1 *   11/2003

(Continued)

OTHER PUBLICATIONS

"Semiconductor Laser", 1st Ed., p. 238, Oct. 25, 1994 along with partial English translation.

(Continued)

*Primary Examiner*—Minsun Harvey
*Assistant Examiner*—Phillip Nguyen
(74) *Attorney, Agent, or Firm*—Wenderoth, Lind & Ponack, L.L.P.

(57) ABSTRACT

In a coherent light source in which limitations on the wavelength of emitted light are relaxed, a coherent light source for simultaneously emitting a first light (3) and a second light (4) having a wavelength shorter than that of the first light (3), includes: a light source main body emitting at least the first light (3); a mirror (5) which transmits or reflects the first light (3); and a functional film (6) provided on at least a part of the mirror (5). The functional film (6) has a photocatalytic effect to be induced by the second light (4).

10 Claims, 11 Drawing Sheets

U.S. PATENT DOCUMENTS

2003/0179798 A1* 9/2003 Egawa et al. .................. 372/69
2007/0263693 A1* 11/2007 Essaian et al. ................ 372/75

FOREIGN PATENT DOCUMENTS

| JP | 09-180253 | | | 7/1997 |
|---|---|---|---|---|
| JP | 2000121548 | A | * | 4/2000 |
| JP | 2000-349389 | | | 12/2000 |
| JP | 2001-70787 | | | 3/2001 |
| JP | 2003-59087 | | | 2/2003 |
| JP | 2003059087 | A | * | 2/2003 |
| JP | 2003-207601 | | | 7/2003 |
| JP | 2003-243761 | | | 8/2003 |
| JP | 2004-179595 | | | 6/2004 |
| JP | 2006186228 | A | * | 7/2006 |

OTHER PUBLICATIONS

"Semiconductor Laser", $1^{st}$ Ed., p. 238, Oct. 25, 1994.

Supplementary European Search Report issued Mar. 31, 2009 in the corresponding European application No. EP 05 71 0523.

Zayhowski, J.J., "Microchip lasers" Optical Materials, Elsevier Science Publishers B.V. Amsterdam, NL, vol. 11, No. 2-3, Jan. 1, 1999, pp. 255-267.

* cited by examiner

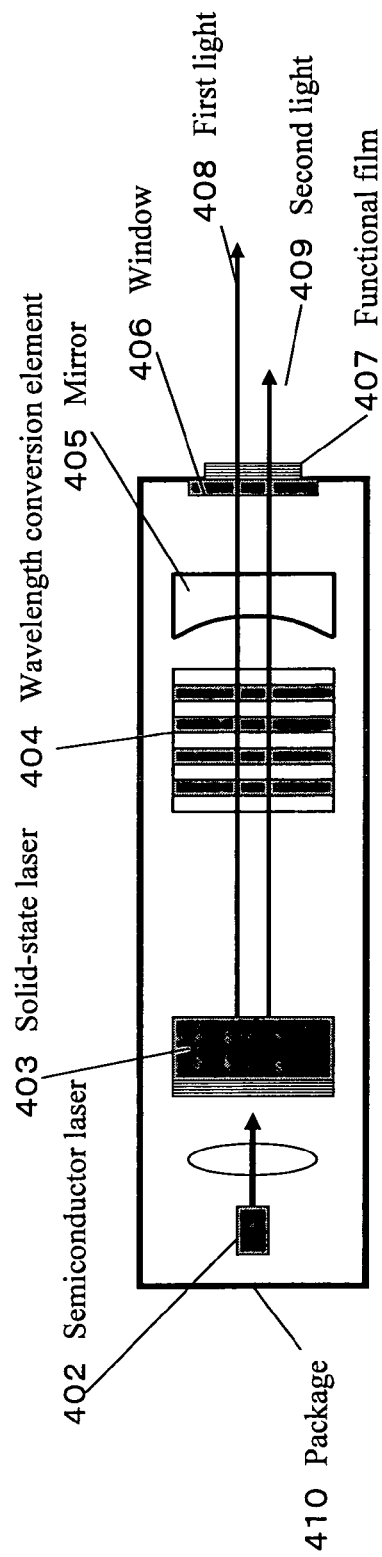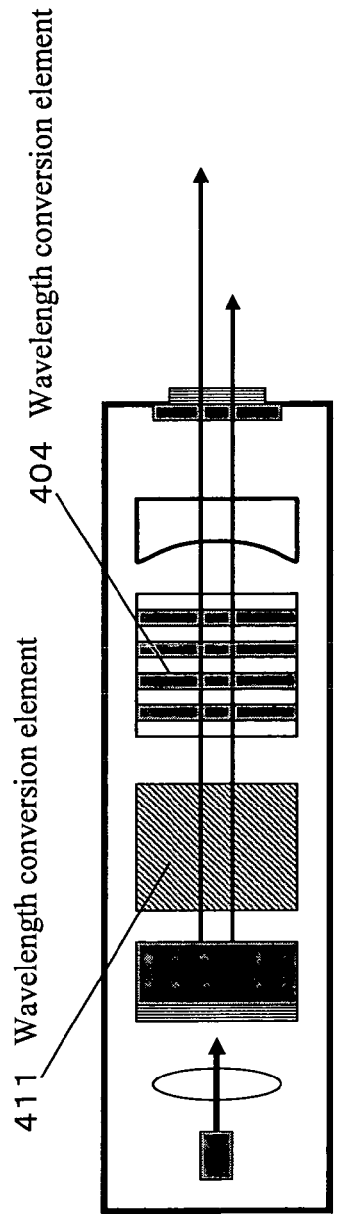
Fig. 3a
Fig. 3b

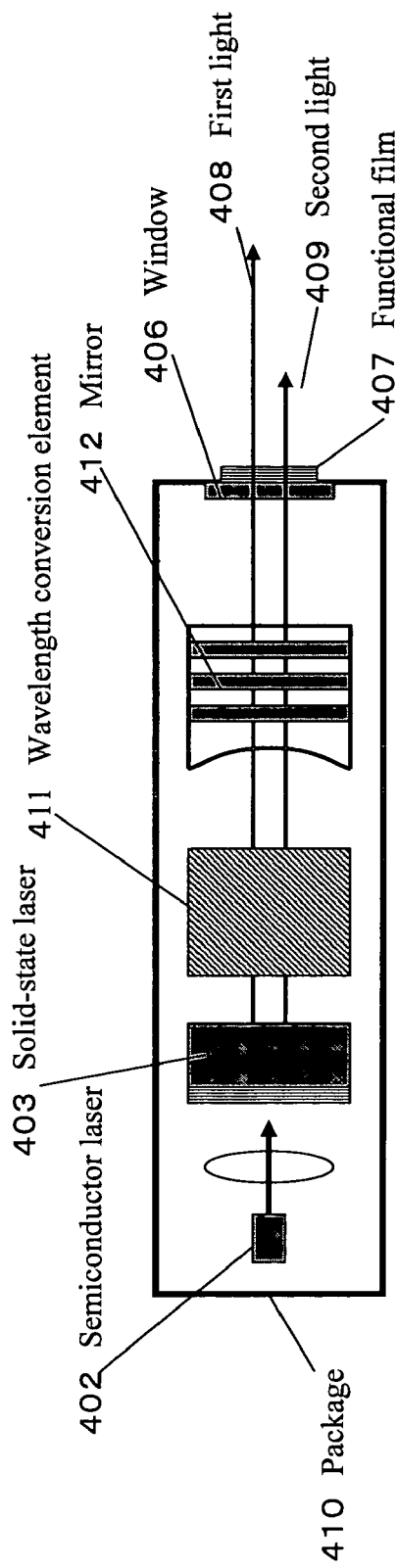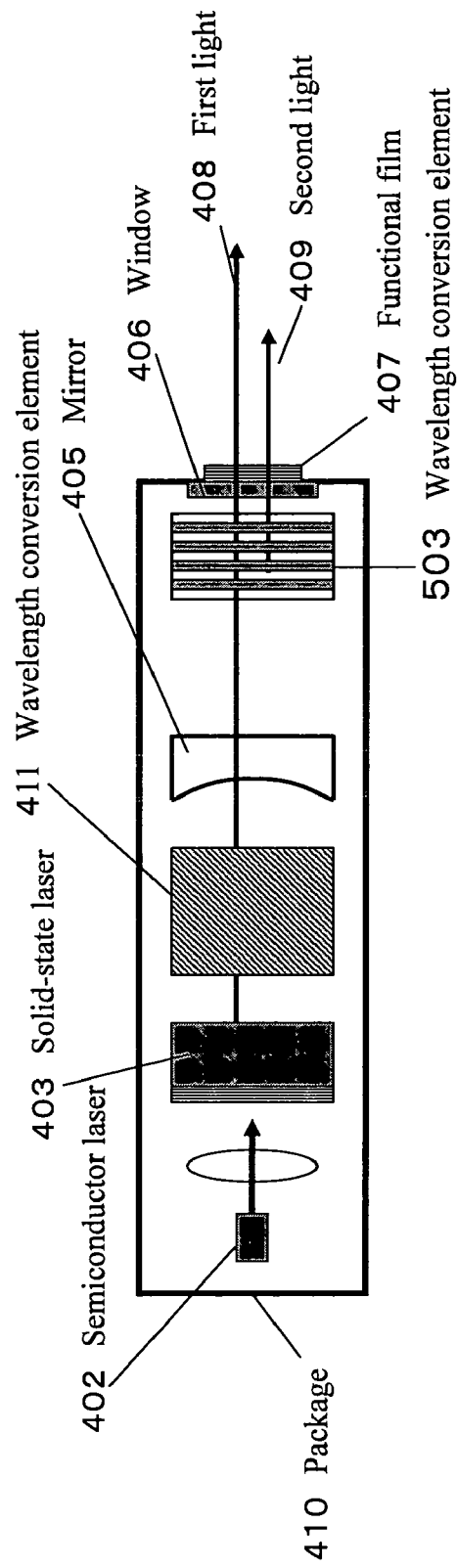
Fig.4a
Fig.4b

COHERENT LIGHT SOURCE AND OPTICAL SYSTEM

TECHNICAL FIELD

The present invention relates to a coherent light source and an optical system, particularly to a coherent light source and an optical system including a functional film which produces a photocatalytic effect.

BACKGROUND ART

A semiconductor laser consisting of III-V nitride semiconductor material ($Al_xGa_yIn_{1-x-y}N$ (herein, $0 \leq x \leq 1$, and $0 \leq y \leq 1$)) such as gallium nitride is a key device for realizing ultra-high density recording on an optical disc and is a blue violet semiconductor laser which is at a level closest to a practical use. Increasing an output of such a blue violet semiconductor laser allows not only rapid writing on optical discs but also application to laser displays. This is an essential technology for developing a new technical field.

In optical disc systems of a recording and reproduction type, a semiconductor laser with a high output is desirable. As an effective way to increase an output, a method to render reflectances of end surfaces of a resonator asymmetrical is known (see, for example, "Handotai reza (semiconductor laser)"; Kenichi Iga Ed.; First edition; Ohmsha Ltd.; Oct. 25, 1994; p. 238). It is a general method for semiconductor lasers used for writing on optical discs. In this method, end surfaces forming a resonator are coated with dielectric films so that the end surfaces have asymmetrical reflectances. Among the end surfaces forming the resonator, a front end surface from which a laser light is emitted has a low reflectance, and a rear end surface on the opposite side has a high reflectance (for example, 10% for the front end surface and 90% for the rear end surface). A reflectance of a dielectric multilayer film can be controlled based on a refractive index, a film thickness and the number of layers laminated of a used dielectric member.

A semiconductor laser is mounted (assembled) to a can package as shown in FIG. 11. The package consists of a base 803 and a cap 804. A semiconductor laser 801 and a submount 802 which is a heat radiator for the semiconductor laser 801 are mounted to the base 803. A space inside the cap is sealed with nitrogen ($N_2$) gas or the like.

The cap consists of glass 806 for taking out light and a metal base (can 805). The cap is adhered with a fusible glass 807 (can be fixed at several hundreds degree) in order to keep air tightness.

Such a semiconductor laser suffers from a problem in that dust and mold may adhere to a surface of the laser package and affect an output property. In order to solve this problem, a method of forming a film having a photocatalytic function on a surface of a package of a laser has been proposed (see Japanese Laid-Open Publication No. 2003-59087).

A solid-state laser has also been developed as a coherent light source with a high output. A wavelength conversion element is inserted into a resonator of the solid-state laser. This enables generating visible light with a high output. In such a solid-state laser, dust attached to laser end surfaces causes deterioration of an outputting property and shortens the life of the laser. In order to solve this problem, a method of providing a film having a photocatalytic effect on a surface of an optical component has been proposed (see Japanese Laid-Open Publication No. 2001-70787). A structure in which a film having a photocatalytic function is formed on a solid-state laser resonator mirror is also shown.

In conventional light sources, it is intended that light from the coherent light source is used to activate a catalytic function of a photocatalyst. However, photocatalyst depends on wavelengths. For activating the photocatalytic functions, wavelengths of the coherent light sources which can be used are limited. Specifically, for activating a photocatalyst efficiently, light sources with a wavelength of 390 nm or shorter are required. Thus, there is a problem in that coherent light sources which can utilize a photocatalyst are limited to light sources with short wavelengths of 390 nm or shorter.

An object of the present invention is to solve the above described conventional problem and provide a coherent light source with eased limitations on wavelengths at emission. Another object of the present invention is to provide an optical system with eased limitations on wavelengths at emission.

SUMMARY OF THE INVENTION

The first aspect of the invention is a coherent light source for simultaneously emitting a first light and a second light having a wavelength shorter than that of the first light, including: a light source main body emitting at least the first light; a member transmitting or reflecting the first light; and a functional film being provided on at least a part of the member. The functional film has a photocatalytic effect to be induced by the second light.

Herein, the photocatalytic effect refers to, for example, an effect of removing an extraneous matter deposited on the member or the like.

According to the present invention, the photocatalytic effect is induced by the second light while the first light is being emitted. A coherent light source having the photocatalytic function with the limitation of emission wavelength being relaxed can be provided. Further, since the photocatalytic function can be achieved, as an additional effect, the coherent light source which can stably emit light for a long period of time can be provided.

The second aspect of the invention is the coherent light source according to the first aspect of the invention, wherein the wavelength of the first light is 400 nm or longer.

According to the present invention, even when the wavelength of the first light is 400 nm or longer, the photocatalytic effect can be induced by the second light.

The third aspect of the invention is the coherent light source according to the first aspect of the invention, wherein the first light and the second light travel approximately the same optical paths.

According to the present invention, the first light and the second light travel approximately the same optical paths. Thus, an optical system which irradiates a position same as that of the extraneous matter deposited on the member by the first light with the second light can be easily formed.

The fourth aspect of the invention is the coherent light source according to the first aspect of the invention, wherein the first light and the second light irradiate approximately equal areas on an irradiation surface of the member including the functional film.

Herein, the irradiation surface refers to, for example, a surface of the member which is irradiated with the first light and the second light.

According to the present invention, the first light and the second light irradiate approximately equal areas. Thus, a position same as that of the extraneous matter deposited on the member by the first light can be irradiated with the second light.

The fifth aspect of the invention is the coherent light source according to the first aspect of the invention, wherein the light source main body includes a semiconductor laser formed of a III-V nitride semiconductor material.

According to the present invention, light can be stably emitted for a long period of time in the semiconductor laser formed of a III-V nitride semiconductor material.

The sixth aspect of the invention is the coherent light source according to the first aspect of the invention, wherein the wavelength of the second light is 390 nm or shorter.

According to the present invention, since the wavelength of the second light is 390 nm, the functional film can be efficiently activated.

The seventh aspect of the invention is the coherent light source according to the first aspect of the invention, further comprising a first wavelength conversion element for converting a part of the first light to the second light.

According to the present invention, since the first light is converted into the second light by the wavelength conversion element, the first light and the second light can be generated approximately coaxially even with a simple optical system.

The eighth aspect of the invention is the coherent light source according to the seventh aspect of the invention, wherein the first wavelength conversion element is formed of a nonlinear optical material or an upconversion material.

According to the present invention, for example, a stable short wavelength light emission becomes possible.

The ninth aspect of the invention is the coherent light source according to the seventh aspect of the invention, wherein: the light source main body is formed of a solid-state laser medium including Nd or Yb. The first wavelength conversion element converts the first light emitted from the solid-state laser into the second light which is a third harmonic.

According to the present invention, stable light emission can be performed for a long period of time, using a solid-state laser.

The tenth aspect of the invention is the coherent light source according to the seventh aspect of the invention, wherein: the light source main body is formed of a solid-state laser medium including Nd or Yb and a second wavelength conversion element for converting light from the solid-state laser into the first light which is a second harmonic. The first wavelength conversion element converts the light from the solid-state laser and the first light into the second light which is sum frequency light.

According to the present invention, stable light emission can be performed for a long period of time, using a solid-state laser.

The eleventh aspect of the invention is the coherent light source according to the seventh aspect of the invention, wherein: the light source main body is formed of a semiconductor laser. The first wavelength conversion element converts the first light emitted from the semiconductor laser into the second light which is a higher harmonic.

According to the present invention, stable light emission can be performed for a long period of time, using a solid-state laser.

The twelfth aspect of the invention is an optical system, including: a coherent light source; a condensing or projecting optical member; and a functional film. The coherent light source simultaneously emits a first light and a second light having a wavelength shorter than that of the first light. The functional film provided on at least a part of the optical member which receives irradiation of light from the coherent light source. The functional film has a photocatalytic effect to be induced by the second light.

Herein, the photocatalytic effect refers to, for example, an effect of removing an extraneous matter deposited on the member or the like.

According to the present invention, the photocatalytic effect is induced by the second light while the first light is being emitted. An optical system having the photocatalytic function with the limitation of emission wavelength being relaxed can be provided. Further, since the photocatalytic function can be achieved, as an additional effect, the optical system which can stably emit light for a long period of time can be provided.

The thirteenth aspect of the invention is the optical system according to the twelfth aspect of the invention, wherein: the functional film is provided on an irradiation surface which receives the first light at power density of 100 W/cm$^2$ or higher in the optical member. The first light and the second light irradiate approximately equal areas on the irradiation surface.

On the irradiation surface which receives the first light having the power density of the above-mentioned value, generally, a large amount of extraneous matter deposits.

According to the present invention, since the functional film is provided on such an irradiation surface, and a portion where the extraneous matter deposits due to irradiation of the first light can be irradiated with the second light, the extraneous matter can be removed efficiently.

According to the structure of the coherent light source of the present invention, a light source having the photocatalytic effect with the limitations on the emission wavelength being relaxed can be provided. Further, another aspect of the present invention can provide an optical system having the photocatalytic effect with the limitations on the emission wavelength being relaxed.

As an additional effect, a light emitting element which can stably operate for a long period of time can be realized. As another additional effect, a stable operation of a system such as an optical discs using short wavelength light sources or an optical system such as a laser display using visible light can be realized.

BRIEF DESCRIPTION OF THE DRAWINGS

FIG. 3 is a diagram showing a structure of a coherent light source according to Embodiment 2 of the present invention;

FIG. 4 is a diagram showing a structure of another coherent light source according to Embodiment 2 of the present invention;

DETAILED DESCRIPTION OF PREFERRED EMBODIMENTS

Hereinafter, embodiments of the present invention will be described with reference to the drawings.

Embodiment 1

Figure 1:
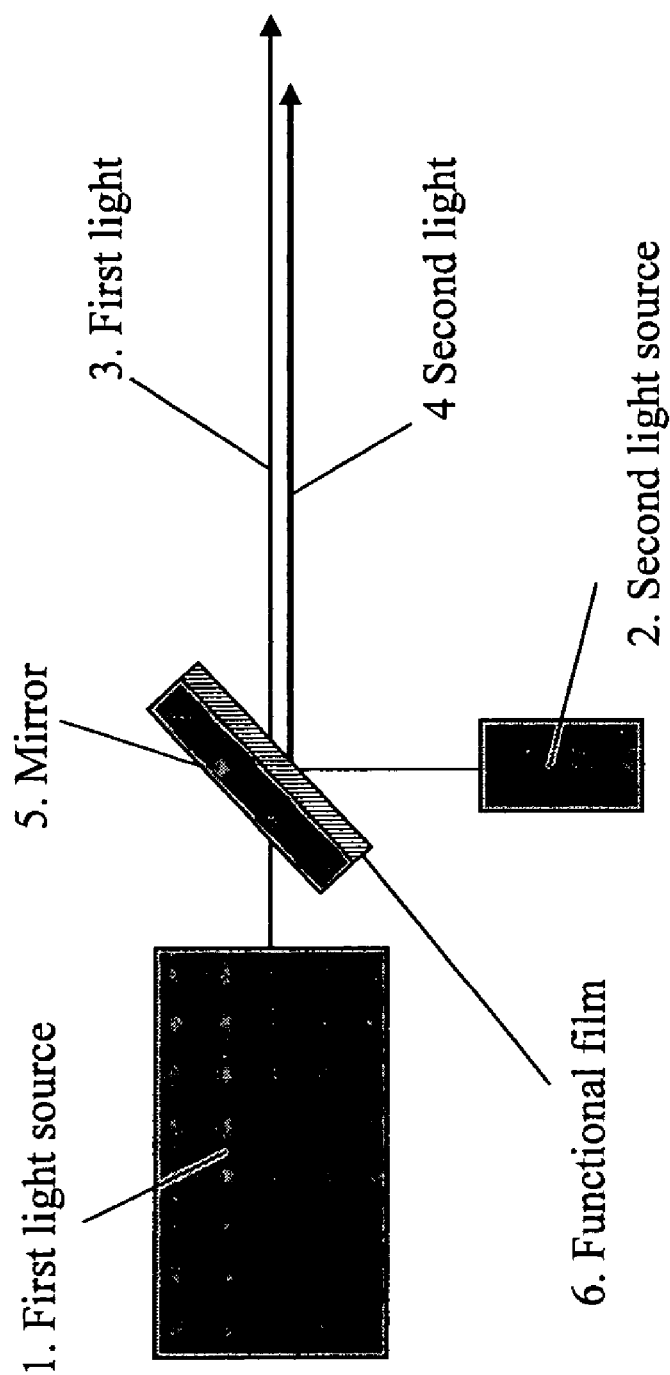
FIG. 1 is a diagram showing a structure of a coherent light source according to the present invention.

FIG. 1 is a diagram showing a structure of a coherent light source according to an embodiment of the present invention. As shown in FIG. 1, first light 3 emitted from a first light source 1 is multiplexed with second light 4 emitted from a second light source 2 by a mirror 5. On a surface of the mirror 5, a functional film 6 is formed. The first light source may be, for example, a GaN semiconductor laser with a wavelength of 410 nm. The second light source may be, for example, a GaN semiconductor laser with a wavelength of 380 nm.

Figure 2:
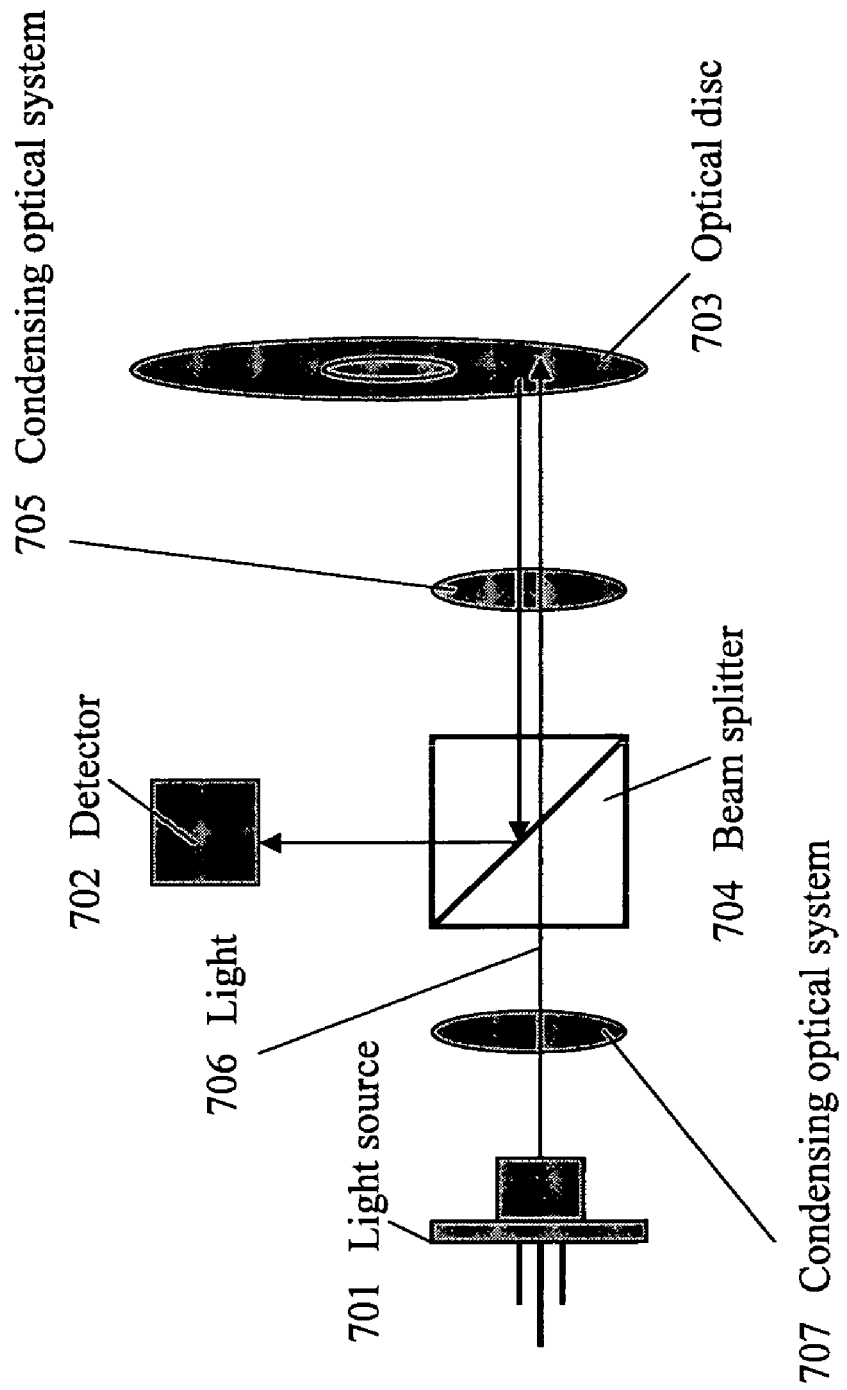
FIG. 2 is a diagram showing a structure of an optical system according to the present invention.

As an example of an optical system using this light source, FIG. 2 shows an optical disc apparatus to which such a light source is applied. In FIG. 2, a light source 701 is a packaged coherent light source as shown in FIG. 1. Light 706 emitted from the light source 701 passes through a condensing optical system 707, a beam splitter 704, a condensing optical system 705, and impinges upon an optical disc 703. Reflected light is reflected off the beam splitter 704 and is detected by a detector 702.

As such an optical system, particularly, a laser with a short wavelength and a high output is used more, a problem is observed more often in a long-term reliability. The problem is that, when a semiconductor laser with a short wavelength is driven at a high output (for example, 30 mW) for a long period of time, hydrocarbon (compounds of C and H, for example, aldehyde) existing near the laser is decomposed by laser light and foreign substances precipitate on end surfaces of optical components in an elliptic pattern. From elementary analysis (mass spectrometry such as EDX), it is found out that these foreign substances include carbon (C) as a main component. The amount of precipitated foreign substances increases significantly as light output increases. This problem becomes more evident as a speed of optical disc apparatuses of recording and reproduction type increases (such a device requires a laser with a high output). Further, such a phenomenon is observed not only in optical systems for optical discs but also in any optical system utilizing a coherent light source with a short wavelength and a high output. This is the reason why the long-term reliability is deteriorated.

In optical systems and light sources forming optical systems, deposition of foreign substances depends on power density of light. Thus, in optical systems, foreign substances deposit more in a portion where power density of light is higher. For example, it is found that the amount of deposited foreign substances increases when power density of light is 100 W/cm$^2$ or higher in an emitting end surface of the light source, a window of a light source package, a light receiving surface of a detector, or any other portion where light is condensed and used in a condensing optical system, mirrors, filters, and the like. The deposition of the foreign substances also depends on usage circumstance largely. For example, they deposit faster in a place where there is more mote, dust, smoke, or the like in the air. These impair a permissive property, a reflective property or the like of optical components, and thus, the life of the optical system is limited.

Such a phenomenon is not observed in other types of semiconductor lasers (a red laser or an infrared laser). The problem is observed particularly in laser light sources with a short wavelength light having a wavelength of 600 nm or shorter, or with a very high power density. This phenomenon becomes more evident in a semiconductor laser with a short wavelength (for example, an oscillation wavelength in 400 nm band).

An object of the present invention is to provide an optical system and a coherent light source which solve the above-described problem and stably operate for a long period of time, and to realize a stable operation of a system for optical discs or the like which uses a laser with a short wavelength.

A method of using a self-cleaning function by a photocatalytic effect is drawing attention as a method for preventing deposition of foreign substance in optical systems. In this method, hydrocarbon is changed to $CO_2$, $H_2O$ or the like by a strong photocatalytic effect of a functional film such as $TiO_2$ or the like which is coated on an outermost part of an optical surface. This can prevent deposition of foreign substances in the optical systems.

However, for a functioning photocatalyst, irradiation of ultraviolet light for activating photocatalyst is essential. If titanium oxide of rutile type is used as a photocatalyst, light having a wavelength of 413 nm or shorter is necessary for activation. If titanium oxide of anatase type is used, light having a wavelength of 388 nm or shorter is necessary for activation. If titanium oxide doped with Cr is used, a wavelength required by activation can be longer up to around 500 nm. However, irradiation of light having a wavelength of 390 nm or shorter is required for efficiently activating titanium oxide.

In order to solve such a problem, the present invention proposes a light source emitting first light which is desired as light of the light source along with second light having a wavelength of 390 nm or shorter with approximately the same optical axis.

FIG. 1 is a diagram showing a structure of a light source according to the present invention. In FIG. 1, a dichroic mirror 5 multiplexes different wavelengths. A functional film 6 is deposited on a surface of the mirror to prevent deposition of a foreign substance.

In the optical system using such a light source as shown in FIG. 2, light 706 emitted from the light source 701 includes second light having a wavelength of 390 nm and an optical axis which is substantially coaxial to that of first light to be used. Among portions to be irradiated with the first light, a functional film is deposited to a portion which receives light at a particularly high power density and where foreign substances deposit. For example, a functional film is deposited to at least a part (at least one surface) of optical elements which form the optical system and which transmit or reflect the first light (for example, windows of a package of the light source 701, a condensing optical system 705, a condensing optical system 707 or a beam splitter 704), and the like.

The light source 701 is described as the coherent light source shown in FIG. 1. However, when a functional film is deposited on a part of optical elements, the light source 701 does not always have to be the coherent light source shown in FIG. 1. Specifically, when a functional film is deposited on a part of optical elements, the light source 701 does not have to include a functional film as long as it can emit two rays of light with different wavelengths.

In the structure shown in FIGS. 1 and 2, the first light and the second light are propagated approximately coaxially. Thus, the second light can efficiently impinge upon portions where foreign substances tend to deposit. This can reduce power consumption. Since a light source or an optical system for activating a functional film does not have to be provided separately, the optical system can be simple and miniaturized. Further, since the deposited foreign substances in the system can be cleaned automatically, reliability of the optical system is improved and the life increases significantly.

Further, as shown in FIG. 2, when the optical system employing the light source of the present invention is formed, adjustments of the light source and the optical system are required for efficiently transmitting the second light which has the self-cleaning function through the optical system. For example, preferable adjustment in the light source is to use light having a wavelength of 340 nm through 390 nm as the second light. This is because, as the wavelength is shortened, it becomes more difficult to select an optical system which transmits ultraviolet light while the photocatalytic effect does not decrease so much. For example, a material of optical components such as a lens or a filter is limited to quartz if the wavelength is 340 nm or shorter. This results in a problem of an increase in the cost of the optical system. On the other hand, if the wavelength is 390 nm or longer, the efficiency of photocatalytic effect is reduced significantly.

Embodiment 2

Another example of the coherent light source according to the present invention will be described with reference to FIG. 3. In this example, a solid-state laser is used as a main body of the light source.

Solid-state lasers excited by semiconductor lasers, particularly, those formed of a solid laser material doped with ions such as Nd, Cr, and the like, are widely used. In FIG. 3, a YAG laser doped with Nd, which is typically used, is shown as a light source main body. A semiconductor laser 402 for exciting a solid-state laser irradiates a solid-state laser medium 403 (YAG laser medium) with light having a wavelength of 808 nm. The solid-state laser medium is resonated by a resonator mirror 405 and performs laser oscillation. Laser oscillation mainly outputs infrared light having a wavelength of 1.064 μm, but the output has a high outputting property of few watts to several tens of watts or higher.

In the case where such a solid-state laser is used, there is also a concern that a foreign substance may deposit on a laser mirror positioned within an optical path of the laser light and in an optical system using the solid-state laser. For solving this problem, a structure in which a wavelength conversion element 404 is inserted as shown in FIG. 3(a) is proposed.

For example, for solid-state laser oscillation at a wavelength of 1.06 μm, a wavelength conversion element 404 for converting the light to a third harmonic is inserted. This results in a wavelength conversion of a part of the laser light into a third harmonic having a wavelength near 355 nm. In this way, a first light 408 which is the basic wave having the wavelength of 1.06 μm, and a second light 409 which is a third harmonic are emitted with approximately the same optical axes.

The semiconductor laser 402, the solid-state laser medium 403, the wavelength conversion element 404, and the mirror 405 are enveloped in a package 410. The light is emitted through a window 406. At the window 406, a power density of the light is high. Thus, a functional film 407 is deposited thereon. The functional film 407 deposited at the window 406 is irradiated with the second light having the wavelength of 355 nm. Thus, the functional film 407 is activated and deposition of a foreign substance to the window 406 can be prevented.

A functional film may also be provided at, for example, a part of the mirror 405 which locates within an optical path of the laser light.

An optical element with a functional film deposited thereon may also be used in an optical system employing the above-described coherent light source. In this case, a self-cleaning function is induced by the second light which impinges coaxially with the first light, thereby reducing degradation of the optical element significantly.

The coherent light source employing such a solid-state laser can have several kinds of forms.

FIG. 3(b) shows another structure where a wavelength conversion element denoted by reference numeral 411 is provided in the solid-state laser, and a basic wave of the wavelength of 1.06 μm is converted into a second harmonic by the wavelength conversion element 411 to generate green light having a wavelength near 530 nm.

For mixing an ultraviolet ray having the wavelength of 380 nm or shorter into the green light, a sum frequency of the light of 1.06 μm from the solid-state laser and light having the wavelength of 530 nm from the wavelength conversion element 411 is generated by the wavelength conversion element 404. In this way, it becomes possible to generate an ultraviolet ray having a wavelength of 355 nm.

As the light source wavelength becomes short, an extraneous matter mainly formed of carbon (C) is generated more by a large amount. In the light source with an output of few watts, an extraneous matter at a laser mirror or the like at the wavelength of 532 nm increases by one order of magnitude or more compared to that with infrared light. Thus, the self-cleaning effect by photocatalyst is significant in the mirror or the glass window, and a durability of the laser largely increases.

Other types of forms such as structures shown in FIG. 4 are also possible.

FIG. 4(a) shows an example in which an external mirror 412 of the resonator is formed of a wavelength conversion element. MgO:LiNbO$_3$ is used as a substrate and a polarization inversion structure having a periodic pattern is formed therein. Thus, the external mirror 412 has a wavelength conversion function. As a nonlinear optical crystal, wavelength conversion materials for ultraviolet rays such as LBO, BBO, CLBO and the like can also be used. These wavelength conversion materials are crystals having a property to transmit to ultraviolet rays. Since their transmitting properties are high, they are promising materials for resonator mirrors.

By forming the external mirror 412 of the wavelength conversion element as described above, the optical system can be simplified.

In the structure shown in FIG. 4(b), a wavelength conversion element 503 is provided outside the laser resonator.

By providing the wavelength conversion element 503 outside the resonator, the structure of the resonator can be simplified, and unstableness of the resonator due to a resonator noise and the like can be reduced.

As described above, if a part of the laser light is converted by the wavelength conversion element to generate ultraviolet rays, it becomes possible to overlap a second light, which is ultraviolet ray inducing the photocatalytic function, to the first light which is generated coaxially.

The primary effect of these structures is that the amount of deposited foreign substances mainly formed of carbon can be significantly reduced by depositing the functional film 407 on the window 406 of the coherent light source. In a conventional solid-state laser with a high output, a periodical maintenance is required and continuous operation hours are limited since properties are deteriorated due to an extraneous matter on the mirrors in the structure, and the like. According to the present invention, a wavelength conversion function for converting only a part of the light into ultraviolet light is added to the coherent light source, and thus, the ultraviolet light inducing the photocatalytic function can be generated. As a result, the amount of deposited extraneous matter on the optical system can be reduced, and the continuous operation hours of the laser can be largely increased.

Further, in the structure according to the present invention, the converted light (second light) is generated with an optical axis approximately same as that of the required light (first light). Thus, it becomes possible to efficiently irradiate only places where an extraneous matter deposits. Thus, the optical system can be simplified. Moreover, an amount of light used for photocatalytic effect can be minimized. Thus, efficiency in the use of the light source can be improved.

In optical systems using such coherent light sources, surfaces of optical elements which receive light with a high power density, for example, optical components such as a mirror, a lens, and the like may be covered with functional films to add a self-cleaning function and significantly reduce the amount of deposited foreign substances.

According to the present invention, the second light which is coaxially generated can be easily generated by using wavelength conversion. In wavelength conversion, there is no loss of light due to conversion. The intensity of light required for photocatalytic function is about few milliwatts. Thus, the conversion loss in the first light is very small, and the method is beneficial.

The optical system which effectively uses the coherent light source according to the present invention has to have a property to transmit ultraviolet light having a wavelength of 390 nm or shorter to optical elements. The second light, which is the ultraviolet light, has to reach at least an optical element where foreign substances deposit. Therefore, it is preferable to use a material which does not absorb ultraviolet light so much for optical elements which are located within the optical path to the position of the optical element where foreign substances deposit.

The wavelength conversion elements may be: $KNbO_3$; $KTiOPO_4$; $LiNbO_3$; $LiTaO_3$; $LiNbO_3$ doped with Mg; LBO; BBO; CLBO; quartz; or the like. The structure in which these crystals are periodically polarization-inversed is desirable. Periodical polarization-inversion allows adjusting conversion properties so as to conform to the wavelength of the basic wave to have wavelength conversion. When quartz is used, by employing a structure in which a crystal structure is inversed periodically, wavelength conversion can be performed similarly to the nonlinear materials. For generating harmonics such as second harmonic, third harmonic and the like, phase matching conditions can be adjusted by optimizing the periodical structure. For enhancing tolerance for wavelengths of the phase match wavelength to be converted, a periodical structure of polarization inversion may be designed such that a structure in which conversion is possible across a wide range of the wavelengths is realized. When the element is used in a semiconductor laser where the basic wave has a wavelength which largely fluctuates, it is desirable to design the polarization inversion structure to allow for the wavelength conversion across a wide range of wavelengths so that phase matching can be performed even when the wavelength to be converted fluctuates.

In the present embodiment, the solid-state laser has been described. However, the same is also true of gas lasers, dye lasers, and the like. Lasers having oscillation properties at the wavelength of 400 nm to 500 nm such as Ar lasers, Kr lasers, and the like also have high output properties. Thus, an extraneous matter due to laser irradiation is generated on lasers themselves and optical systems, deteriorating the coherent light sources and the optical systems. In order to solve this problem, if a wavelength conversion element for performing wavelength conversion of a part of laser light into a harmonic is provided and the laser light and light having the wavelength of 390 nm or shorter obtained by converting the laser light are emitted simultaneously, property degradation can be greatly reduced, and stable operation of the optical system using the laser can be realized by coating functional films ($TiO_2$) on outermost surfaces of places where they are required (portions where the deposition of foreign substances tend to occur) in the light source and the optical system.

Figure 5:
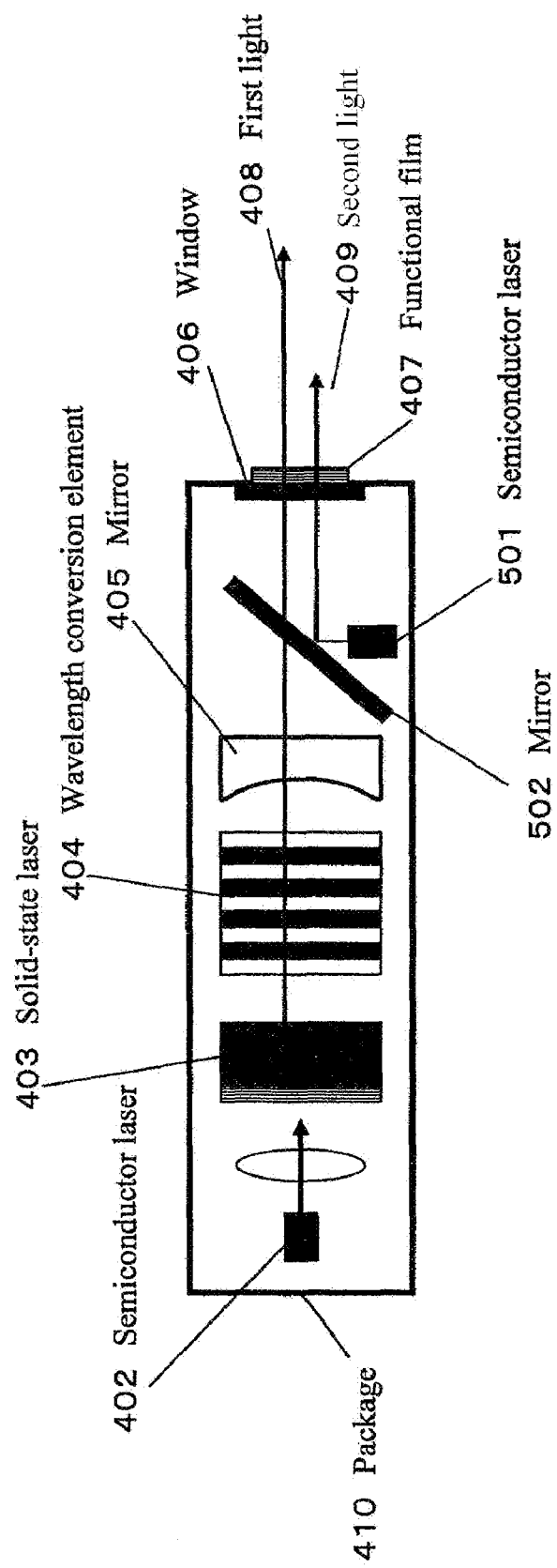
FIG. 5 is a diagram showing a structure of another coherent light source according to Embodiment 2 of the present invention.

A structure employing a GaN semiconductor laser instead of the wavelength conversion element can also be used. The coherent light source according to the present invention which employs the GaN semiconductor laser will be described with reference to FIG. 5.

Light of a semiconductor laser 501 is multiplexed to light from a solid-state laser light source via a dichroic mirror 502. The semiconductor laser 501 is a GaN laser at the wavelength of 380 nm. By providing the GaN laser which has the light collimated coaxially with the light of the solid-state laser, ultraviolet light can be emitted simultaneously. This structure realizes a light source similar to the structure described above.

For a functional film, $TiO_2$ is used. However, $TiO_2$ doped with Cr, Nd, or the like may be used instead to improve efficiency in inducing photocatalytic function.

It is effective if positions where the functional films are provided to deal with an extraneous matter on optical elements and the like are determined as follows. For example, it is desirable to provide functional films on surfaces which receive light with high power density because how much the surfaces tend to have extraneous matter such as carbon due to a trapping function of the light depends on the power density of the light. It is also desirable to provide functional films on the surfaces from which the light is emitted rather than the surfaces where the light impinges because there is more extraneous matter on the emitting surface particularly on the side where light is diverged than on the side where the light is condensed. Therefore, functional films are attached, firstly, to a surface which receives light with a high power density (portion where the power is 100 W/cm² or higher), secondly, to a surface where the light is emitted, and thirdly, to a surface where the light is diverged. It is effective to provide a functional film on an outermost surface of the surface which fulfills the above conditions (for example, a light emitting window of the light source package and the like).

In the present embodiment, wavelength conversion elements using nonlinear optical materials are used. However, wavelength conversion elements using upconversion materials may also be used instead. Upconversion, unlike usual fluorescence, generates light having a wavelength shorter than that of excitation light, and $Yb^{3+}$—$Er^{3+}$ group is known as its material. By adding such materials to glass materials of fluorine group, light having the color of green to blue can be generated from excited light having a long wavelength. In upconversion, the excited light does not depend on the wavelength so much and adsorption is possible across the wide range of wavelengths. Thus, it is possible to generate light having a short wavelength stably.

Embodiment 3

Figure 6:
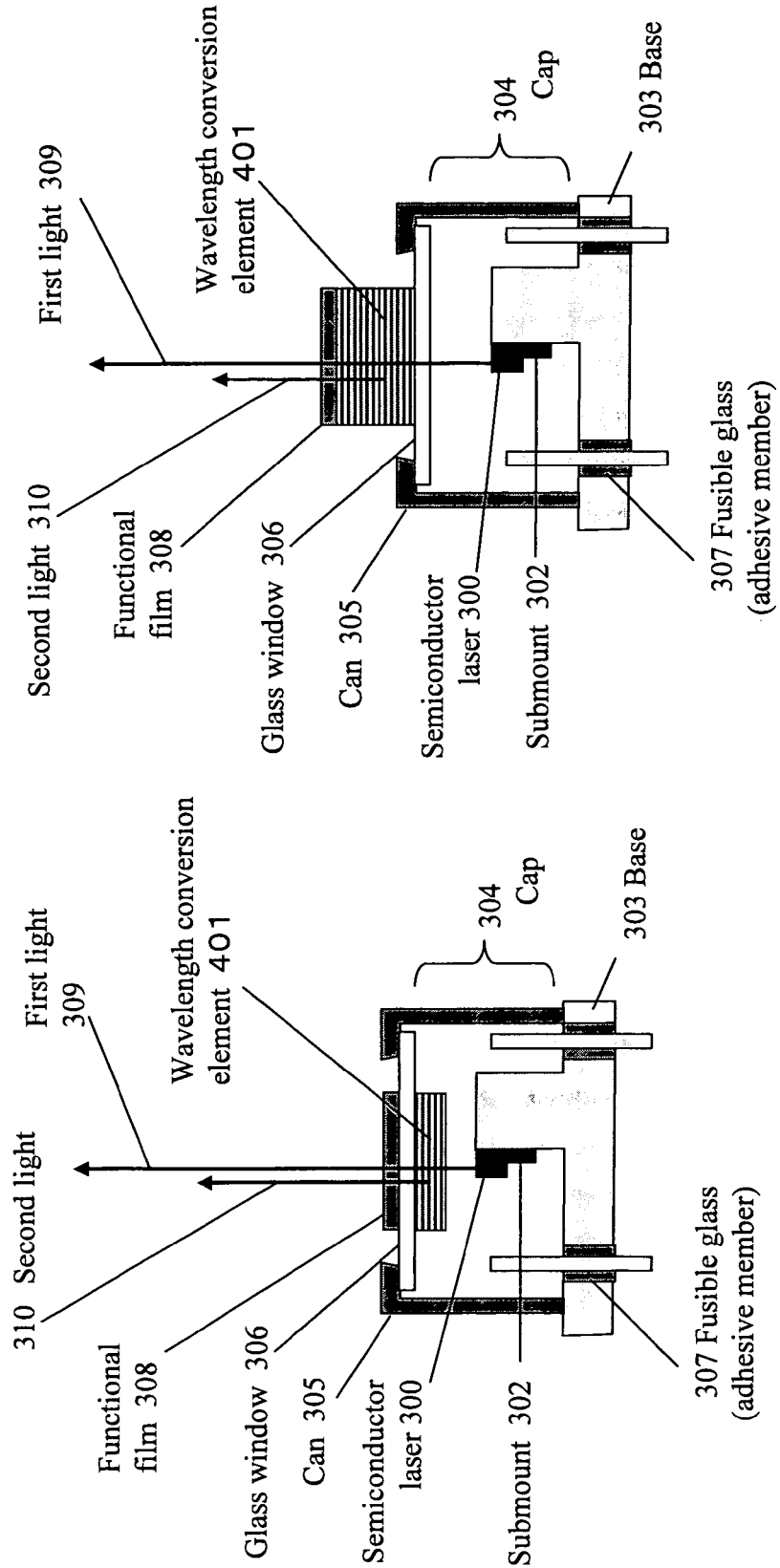
FIG. 6 is a diagram showing a structure of a coherent light source according to Embodiment 3 of the present invention.

The coherent light source according to the present invention which employs a GaN semiconductor laser will be described with reference to FIG. 6.

The GaN semiconductor laser realizes oscillation wavelength of 360 nm to 480 nm and can even generate light in the wavelength range of 500 nm or longer. The output power has been increased as well, and an optical output of several tens of milliwatt is possible.

In a GaN semiconductor laser at a wavelength of 400 nm or longer, there is a problem of deposition of foreign substances in a window portion of a laser package where laser light is focused and a portion which receives light with high power density in an optical system employing the laser. In order to solve this problem, the structures shown in FIG. 6 are proposed.

FIG. 6(a) shows a structure of a semiconductor laser package. A semiconductor laser 300 is soldered to a submount 302 provided on a base 303. A wavelength of a part of first light 309 output from the semiconductor laser 300 is converted by a wavelength conversion element 401 and is output as second light 310. On a surface of a glass window 306, $TiO^2$ is deposited as a functional film 308 and a photocatalytic effect is induced by the second light 310. The semiconductor laser 300 is sealed with a cap 304. Such a structure is effective for a GaN laser with a long wavelength.

For an apparatus which requires light with high luminosity efficiency factor such as a laser display apparatus, light having a wavelength of about 440 to 460 nm is efficient as blue light. The structure of the present invention is effective when a light source for light with such a wavelength is utilized as a light source with a high output of 100 mW or more. Specifically, laser light is converted into a harmonic by the wavelength conversion element to induce the photocatalytic effect at the functional film 308. Thus, degradation in properties due to extraneous matter can be prevented.

As shown in FIG. 6(b), the wavelength conversion element 401 may also be provided outside. As a material for the wavelength conversion element, LBO, BBO, CLBO and the like are effective since light having a short wavelength such as wavelength of 220 to 230 nm is required.

A structure in which a crystal structure of quartz is periodically modified has a transmitting property to a short wavelength and conversion wavelength can be selected by adjusting the period. Such a structure is also stable as a crystal. Therefore, the structure is preferable.

Embodiment 4

Figure 7:
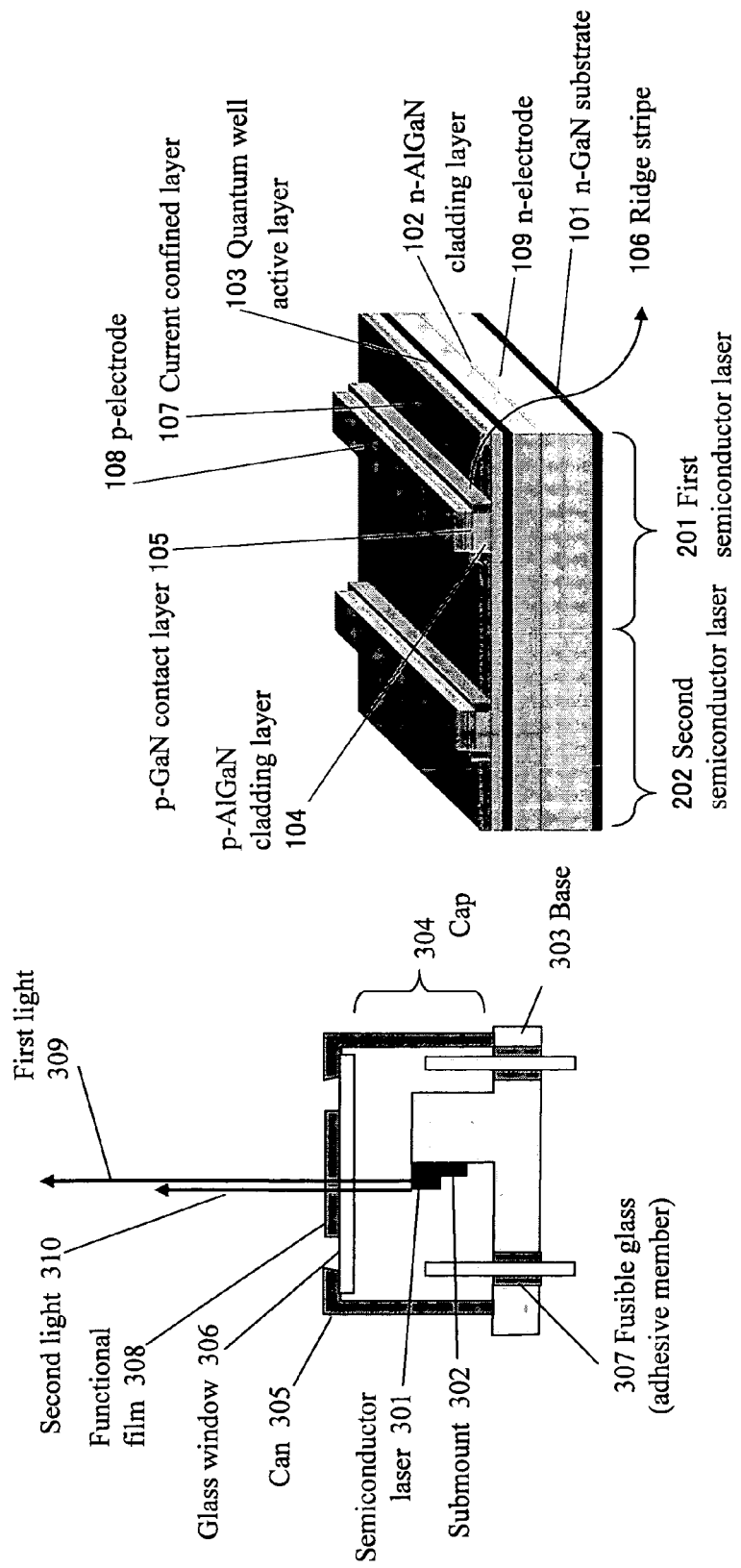
FIG. 7 is a diagram showing a structure of another coherent light source according to Embodiment 4 of the present invention.

FIG. 7(b) is a perspective view of an example of a semiconductor laser, a nitride semiconductor laser element according to the present invention.

The semiconductor laser 301 as a main body of a light source has a basic structure of double hetero (DH) structure. The semiconductor laser 301 includes a n-type cladding layer formed of n-type AlGaN on an n-type GaN substrate 101, an activation layer 103 formed of a multiple quantum well structure including InGaN, a p-type cladding layer 104 formed of p-type AlGaN, and a contact layer 105 formed of p-type GaN.

In the present embodiment, a resonator length, a chip width and a thickness of the element is respectively, 600 μm, 400 μm, and 80 μm. A width of a ridge stripe of a first semiconductor laser 201 is about 1.7 μm. A width of a second semiconductor laser 202 is 10 μm.

The semiconductor laser 301 is formed of the first semiconductor laser 201 and the second semiconductor laser 202. The first semiconductor laser 201 and the second semiconductor laser 202 oscillate at different wavelengths by modifying amounts of In included in the quantum well active layer 103 in the second semiconductor laser 202 and the first semiconductor laser 201. For example, the first semiconductor laser 201 oscillates at a wavelength of 410 nm, and the second semiconductor laser 202 oscillates at a wavelength of 380 nm.

FIG. 7(a) shows a coherent light source in which the semiconductor laser 301 is packaged. In the coherent light source, the semiconductor laser 301 emits first light 309 at the wavelength of 410 nm, and second light 310 at the wavelength of 380 nm simultaneously.

The second light 310 induces the photocatalytic effect of the functional film 308 deposited on the glass window 306. As a result, an extraneous matter on the window glass can be reduced by the self-cleaning effect. Thus, degradation in light source properties can be prevented, and the life can be significantly increased. Since lasers with different wavelengths are formed on one substrate, the first semiconductor laser 201 and the second semiconductor laser 202 can be formed with their light emitting points approximate each other. Thus, they can emit light with approximately the same optical axes. When such a coherent light source is used for forming an optical system, surfaces of optical elements forming the optical system can be self-cleaned by only providing functional films thereon.

It is desirable to form lasers with different wavelengths on one substrate. However, similar effects can be achieved by fixing semiconductor lasers formed on different substrates on the submount 302 with their light emitting points approximate each other. In this case, it is preferable to arrange the semiconductor lasers such that a distance between light emitting points is 100 μm or shorter in order to ensure that two rays of light travel with approximately the same optical axes.

When this semiconductor laser is used as the light source 701 of the optical disc apparatus shown in FIG. 2, the lives of the optical system and the apparatus are largely increased. When this semiconductor laser is applied to optical disc apparatuses and the like, the first semiconductor laser 201 has to have a property of high output and single mode, but the second semiconductor laser 202 for generating the second light may have an output of few milliwatts and a transverse mode may be multimode. Thus, it can be formed relatively easily.

Regarding driving methods of two semiconductor lasers, the first semiconductor laser 201 is used when information is written and called in the optical disc apparatus, but the second semiconductor laser 202 does not have to light simultaneously with the first semiconductor laser 201. The second semiconductor laser 202 is lit when deposition of foreign substances is detected in the optical system and cleaning is needed, in order to reduce power consumption of the coherent light source.

The intensity of the second semiconductor laser 202 when it is used is desirably 1/10 or less that of the first semiconductor laser 201. As the power of the second semiconductor laser 202 comes closer to that of the first semiconductor laser 201, it may undesirably degrade information on the medium when information is read from or written to the optical disc. Thus, it is preferable to limit the laser power of the second semiconductor laser 202 when in use.

In the present embodiment, the semiconductor laser is formed on the GaN substrate 101. However, the substrate may be any substrate on which III-V nitride semiconductor can epitaxially grow, for example, a sapphire substrate, a SiC substrate, or the like.

In this embodiment, the semiconductor laser having one stripe structure formed in one laser element has been described. However, a semiconductor laser of a multibeam type, in which a plurality of stripes are formed in one laser element can achieve similar effects. Further, the method of the present invention can also be applied to a large output semiconductor laser which does not necessarily require laser oscillation in only basic transverse mode. Thus, precipitation of carbons can be suppressed, and a semiconductor laser with a large output can be stably operated.

In the present embodiment, the semiconductor laser element formed of III-V nitride semiconductor material has been described. However, the semiconductor laser element is not limited to this, and may be a light emitting element such as a light emitting diode element (particularly, with a wavelength of 450 nm or shorter). The above-described effects can be achieved by using all the mixed crystal compound semiconductor including BAlGaInN, arsenic (As), phosphorous (P), or the like.

Embodiment 5

Figure 8:
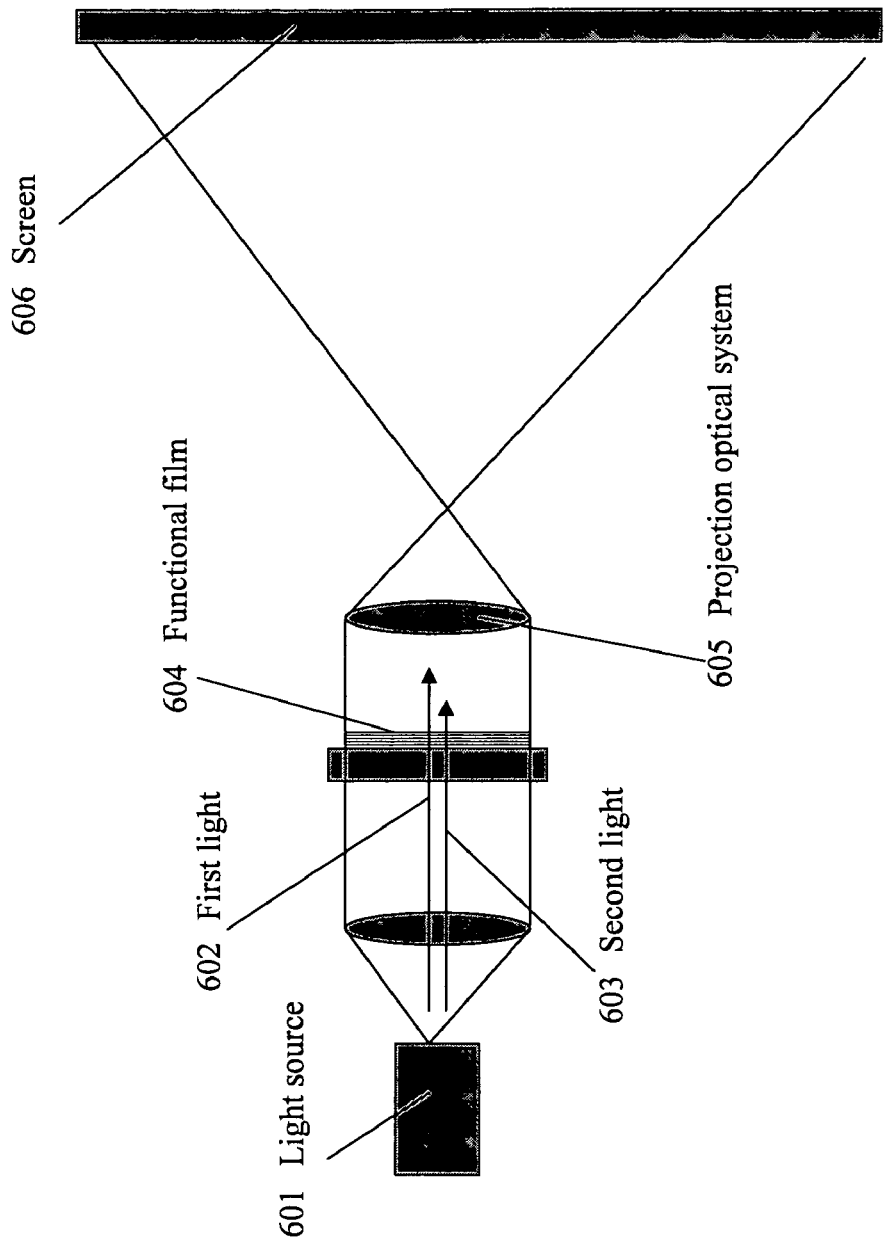
FIG. 8 is a diagram showing a structure of an optical system according to the present invention.

FIG. 8 shows a laser display apparatus, an example of the optical system according to the present invention. Regarding the structure, first light 602 and second light 603 emitted from the light source 601 are projected on a screen 606 by a projection optical system 605. A $TiO_2$ film 604 is deposited on an outermost surface of at least one side of an optical system in a path. In an optical system shown in FIG. 8, the coherent light source described in the above embodiments may be used. However, any type of coherent light source may be used as long as it can emit the first light 602 and the second light 603 which has a wavelength shorter than that of the first light 602 simultaneously.

In this optical system, the second light 603 emitted from the light source 601 induces the photocatalytic effect of a functional film 604 formed in the optical system to prevent precipitation of carbon (C) deposited in the optical system.

Since the first light 602 and the second light 603 are emitted approximately coaxially, they irradiate almost equal areas of an irradiation surface of an optical element. Thus, extraneous matter such as carbon deposited by the first light 602 can be efficiently cleaned by the second light 603 and the functional film. The coherent light source 601 and the functional film 604 according to the present invention can solve a problem conventionally observed. The problem is that, when a semiconductor laser at a short wavelength is driven with a large output for a long period of time, hydrocarbon existing in an optical system (volatile matter of C and H, or the like) is decomposed by laser light and foreign substances including at least carbon (C) precipitate on an emitting end surface of the laser, or glass, or in an optical system.

According to the present invention, an optical system which solves the above-described conventional problem and which can operate stably for a long period of time can be provided, and it becomes possible to realize a stable operation of a system for optical discs and the like which uses a laser at a short wavelength.

(Others)

In the above-description, the coherent light sources using semiconductor lasers and solid-state lasers are described as coherent light sources. However, other types of coherent light source, for example, those employing a fiber laser which is one type of the solid-state laser may be used.

Figure 9:
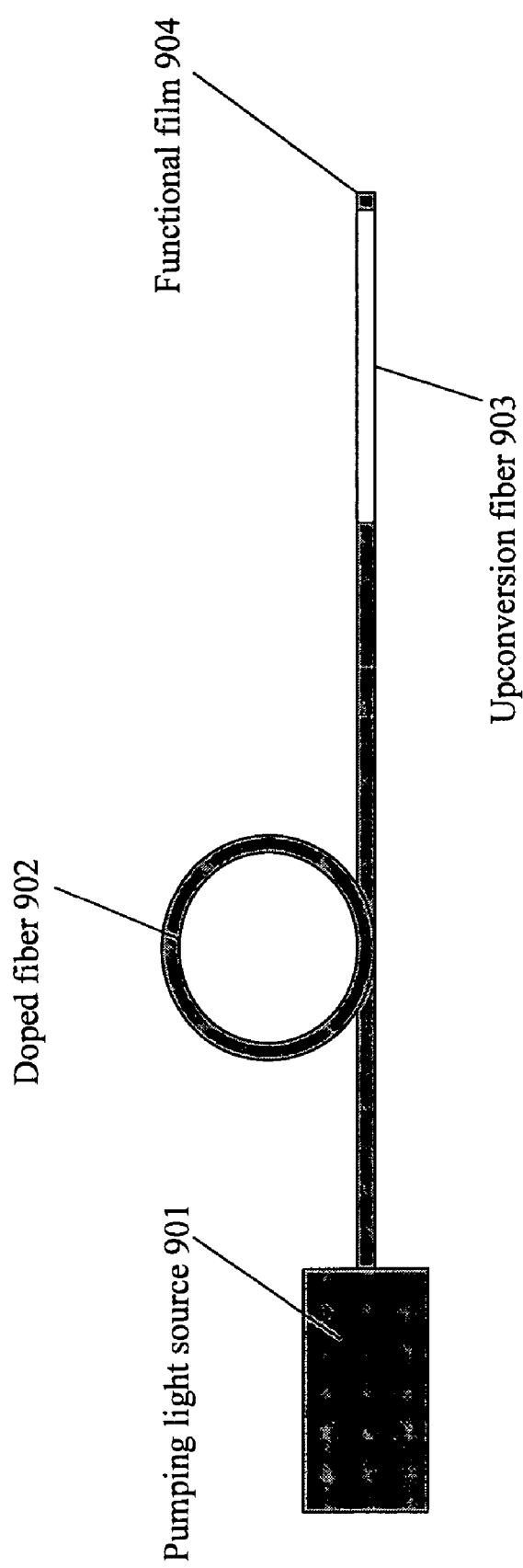
FIG. 9 is a diagram showing a structure of a coherent light source according to the present invention.

With reference to FIG. 9, the structure in which a fiber laser is used will be described as another type of coherent light source according to the present invention.

In FIG. 9, reference numeral 901 refers to a pump light source (a semiconductor laser at a wavelength of 915 nm), 902 refers to a Yb doped fiber laser, 903 refers to an upconversion fiber, and 904 refers to a functional film.

The doped fiber laser 902 is excited by the pump light source 901 and performs laser oscillation near 1080 nm. A part of light of 1080 nm is converted into light of a short wavelength by the upconversion fiber 903. The light of 1080 nm and the light of short wavelength are simultaneously emitted from a fiber end.

On a surface of the fiber end, the functional film 904 is formed. The functional film 904 prevents deposition of an extraneous matter on the end surface of the upconversion fiber 903 with a photocatalytic effect induced by the light of the short wavelength.

Since the fiber laser 902 allows for increasing an output and oscillation at a single transverse mode, a power density of the light is high. Therefore, conventionally, a large amount of foreign substances deposit at an end surface of the fiber laser 902. According to the present invention, the functional film 904 and the upconversion fiber 903 as the short wavelength light source are provided, so cleaning of the end surface is effectively performed. Since beam quality is high, and a condensing property is good as well, the power density of the light can easily be improved. Thus, according to the present invention, a functional film may also be provided on an optical system handling an output from the laser to effectively perform cleaning.

In the present invention, the upconversion fiber is used. However, harmonics can be generated using, for example, wavelength conversion elements. A material to be doped to the fiber may be Yb, Nd, Er, Er/Yb, and the like.

As the output from the fiber laser increases, a problem of degradation of the fiber end surface is more observed. The degradation is caused because the power density of the light in the fiber is high, and an end surface break is generated in a slight degraded layer on a surface of the fiber end. Along with this degradation, deposition of dusts and the like due to laser trapping is also observed on the fiber end surface because the power density is high. There is also a problem that dirt on the end surface absorbs light and causes the end surface break.

Conventionally, a method of putting an end cap on the fiber end surface of the fiber laser is used for reducing the power density at the fiber end surface. The end cap is made of a bulk material, and is used for enlarging a beam diameter in the end cap to reduce the power density at the emitting end surface.

Figure 10:
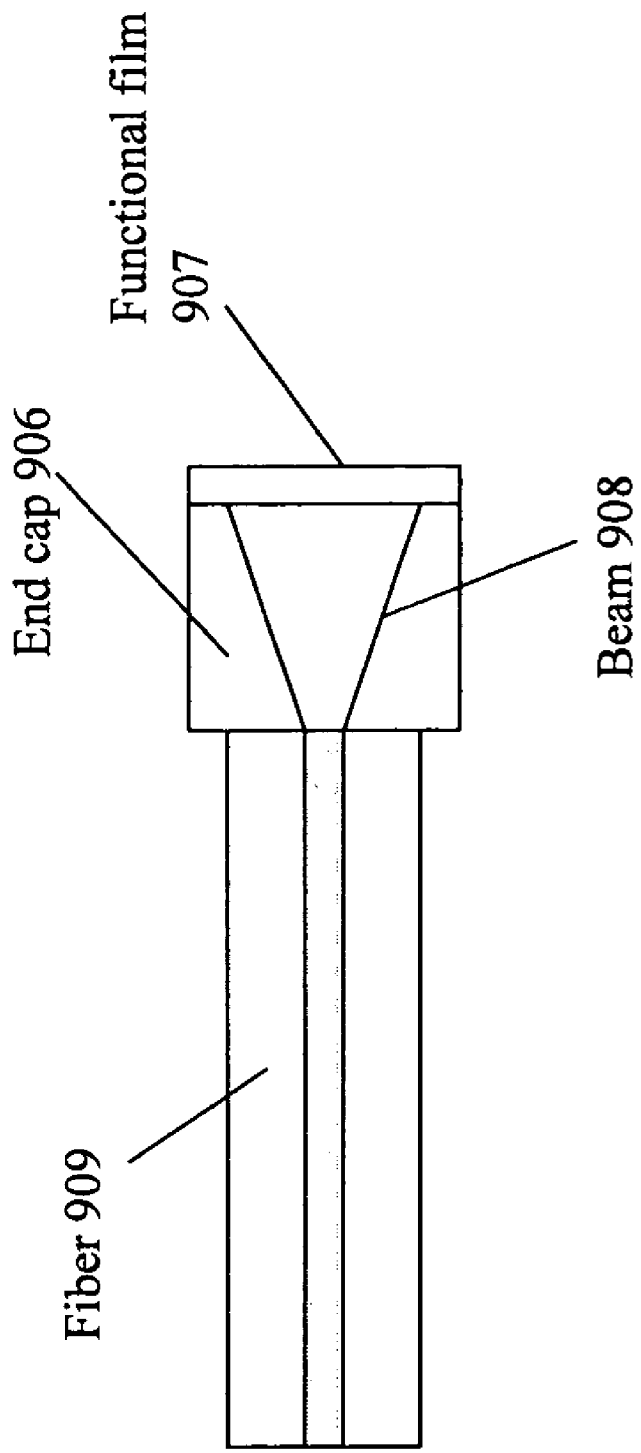
FIG. 10 is a diagram showing a structure of a fiber laser according to the present invention.
Figure 11:
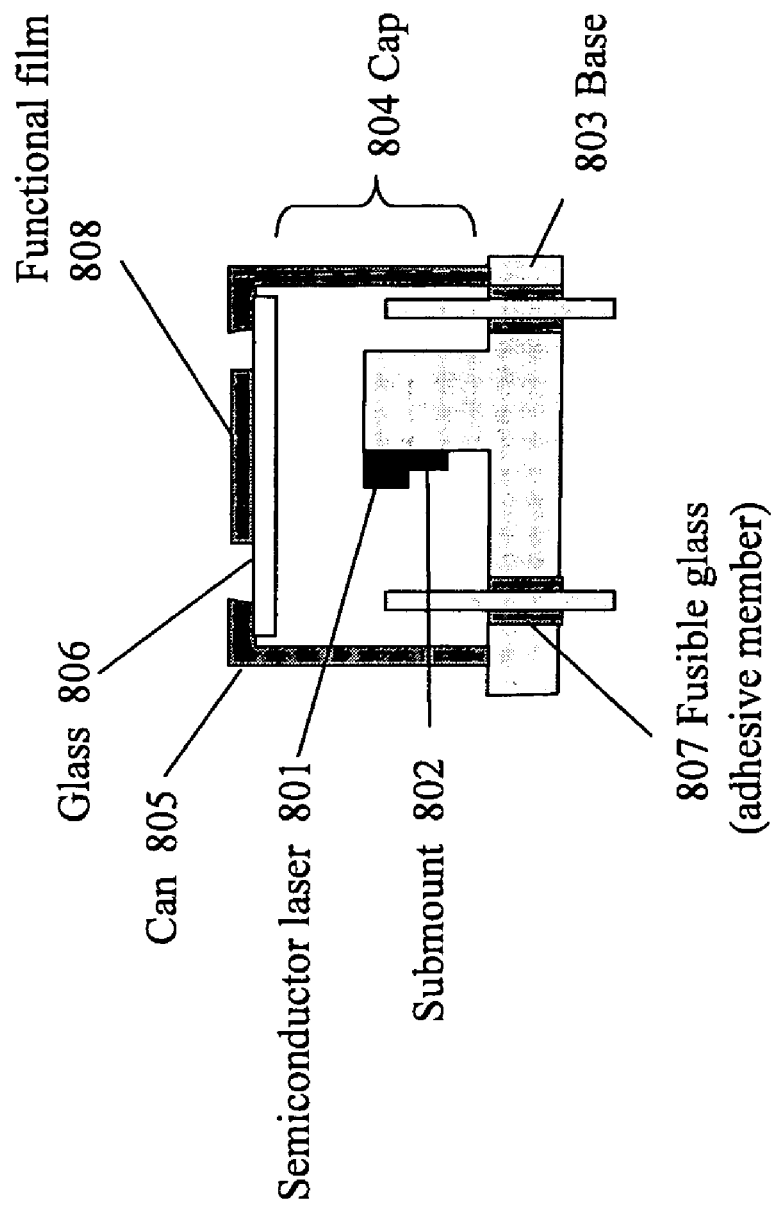
FIG. 11 is a schematic diagram showing an example of conventional semiconductor lasers.

According to the present invention, as shown in FIG. 10, a wavelength conversion function may be provided to the end cap 906. Further, according to the present invention, a functional film 907 may be provided on the emitting end surface of the end cap 906. A wavelength of a part of light from the fiber laser is converted to short wavelength, and the wavelength-converted light induces the photocatalytic effect of the function film 907 provided on the emitting end surface of the end cap 906. In this way, a cleaning effect can be applied to the light emitting portion of the fiber laser.

INDUSTRIAL APPLICABILITY

The coherent light source according to the present invention is effective as coherent light sources generating short wavelength light with a large output. The coherent light source according to present invention is also effective in optical systems in the optical information process field such as optical discs, copiers or printers such as laser printers, lighting apparatuses, optical communication, laser displays, laser process, medical use, and the like, which employ coherent light sources.

What is claimed is:

1. A coherent light source for simultaneously emitting a first light and a second light having a wavelength shorter than that of the first light, comprising:
   a light source main body for emitting at least the first light;
   a member arranged to transmit or reflect the first light; and
   a functional film being provided on at least a part of the member, the functional film having a photocatalytic effect to be induced by the second light, wherein the first light and the second light are to irradiate approximately equal areas on an irradiation surface of the member including the functional film, wherein the wavelength of the first light is greater than or equal to 400 nm and less than or equal to 460 nm, and the wavelength of the second light is less than or equal to 390 nm.

2. The coherent light source according to claim 1, wherein the first light and the second light travel approximately the same optical paths.

3. The coherent light source according to claim 1, wherein the light source main body includes a semiconductor laser formed of a III-V nitride semiconductor material.

4. The coherent light source according to claim 1, further comprising
a first wavelength conversion element for converting a part of the first light to the second light.

5. The coherent light source according to claim 4, wherein the first wavelength conversion element is formed of a nonlinear optical material or an upconversion material.

6. The coherent light source according to claim 4, wherein the light source main body is formed of a solid-state laser medium including Nd or Yb, and
the first wavelength conversion element is arranged to convert the first light emitted from the solid-state laser into the second light which is a third harmonic.

7. The coherent light source according to claim 4, wherein the light source main body is formed of a solid-state laser medium including Nd or Yb and a second wavelength conversion element for converting light from the solid-state laser into the first light which is a second harmonic, and
the first wavelength conversion element is arranged to convert the light from the solid-state laser and the first light into the second light which is sum frequency light.

8. The coherent light source according to claim 4, wherein the light source main body is formed of a semiconductor laser, and
the first wavelength conversion element is arranged to convert the first light emitted from the semiconductor laser into the second light which is a higher harmonic.

9. An optical system, comprising:
a coherent light source for simultaneously emitting a first light and a second light having a wavelength shorter than that of the first light;
a condensing or projecting optical member; and
a functional film being provided on at least a part of the condensing or projecting optical member which is arranged to receive irradiation of light from the coherent light source,
the functional film having a photocatalytic effect to be induced by the second light,
wherein the first light and the second light are to irradiate approximately equal areas on an irradiation surface of the condensing or projecting optical member including the functional film,
wherein the wavelength of the first light is greater than or equal to 400 nm and less than or equal to 460 nm, and the wavelength of the second light is less than or equal to 390 nm.

10. The optical system according to claim 9, wherein the functional film is provided on the irradiation surface, the irradiation surface being arranged to receive the first light at a power density of 100 W/cm$^2$ or higher in the optical member.

* * * * *